United States Patent [19]
Masahiko

[11] Patent Number: 5,852,289
[45] Date of Patent: Dec. 22, 1998

[54] NON-CONTACT TYPE IC CARD AND METHOD OF PRODUCING THE SAME

[75] Inventor: Tsumori Masahiko, Kyoto, Japan

[73] Assignee: Rohm Co., Ltd., Kyoto, Japan

[21] Appl. No.: 750,291

[22] PCT Filed: Sep. 21, 1995

[86] PCT No.: PCT/JP95/01910

§ 371 Date: Dec. 4, 1996

§ 102(e) Date: Dec. 4, 1996

[87] PCT Pub. No.: WO96/09175

PCT Pub. Date: Mar. 28, 1996

[30] Foreign Application Priority Data

Sep. 22, 1994 [JP] Japan .................................... 6-227703
Dec. 27, 1994 [JP] Japan .................................... 6-325072
Apr. 13, 1995 [JP] Japan .................................... 7-087859

[51] Int. Cl.⁶ .................................................. G06K 19/06
[52] U.S. Cl. ......................... 235/492; 235/380; 235/488
[58] Field of Search .................................. 235/488, 492, 235/380

[56] References Cited

U.S. PATENT DOCUMENTS 4,897,534  1/1990  Haghiri-Tehrani ...................... 235/488
4,999,742  3/1991  Stampfli ................................. 361/400

*Primary Examiner*—Harold Pitts
*Attorney, Agent, or Firm*—Baker & Botts, L.L.P.

[57] ABSTRACT

In a non-contact type IC card having an electric part composed of a substrate and an IC chip attached to the substrate, the electric part is disposed outside a loop of an antenna coil. A reinforcing plate is provided on the substrate at the side of an attachment surface of the IC chip so as to surround an outer circumference edge of the IC chip. The non-contact type IC card is produced by filling a semisolid fixing resin into a resin hole formed of a resin film and a spacer having a hole wider than an outer area of the card and thicker than the electric part; embedding the electric part and the antenna coil in the fixing resin to temporarily fixing them; curing the fixing resin while a film is press-contacted with at least one surface of the fixing resin; and drilling a part of the fixing resin and the film at the same time.

8 Claims, 10 Drawing Sheets

5,852,289

NON-CONTACT TYPE IC CARD AND METHOD OF PRODUCING THE SAME

TECHNICAL FIELD

The present invention relates to a non-contact type IC card, and particularly, to a structure of the non-contact type IC card and a method of effectively producing the non-contact type IC card.

BACKGROUND ART

Recently, a non-contact type IC card has been used as a coupon card for a lift in a ski slope, a coupon card and a pass card for trains or buses, or a tag for managing stock, in which data can be identified and renewed without taking out the card at any time to insert it into a reading device at a place such as a ticket gate.

The basic structure of this kind of non-contact type IC card (hereinafter referred to as IC card) is shown in sectional views of FIGS. 14(a) and 14(b). That is, as shown in FIG. 14(a), the IC card is formed such that a substrate 201 mounted with an electric part and an antenna coil 202 are disposed in a tray-shaped resin case 203c, and a resin cover body 203d or the like covers an upper portion of the case. Alternatively, as shown in FIG. 14(b), the IC card is formed such that a resin spacer 203e formed correspondingly to the largeness of the card is disposed on a resin thin plate 203c, a substrate 201 mounted with an electric part and an antenna coil 202 are inserted in the spacer, and then a resin body 203d covers an upper portion.

Generally, the thus formed IC card does not include a built-in cell as a power source. The electric power required for the card 210 is obtained such that when a person having the card passes near a ticket examining device placed at a thicket gate in a place such as a ski slope, the antenna coil 202 receives an electric wave transmitted from transmitting means of the ticket examining device and the electric part on the substrate 201 detects the wave to charge a capacitor. Using this electric power, a semiconductor device such as a built-in microcomputer as the electric part is driven to rewrite data of fees or the like, and the result is transmitted to the ticket examining device, so that the ticket examining device identifies the state of use of the IC card, and only a qualified person or a matter is passed or led to a predetermined direction.

As described above, since data identification can be conducted in the non-contact manner with mutual communication using the electric wave, it is not necessary to take out the card 210 to insert it into the ticket examining device at any time when a person having the card passes through the ticket gate, a time for ticket examination can be shortened, and delay can be relaxed. Due to these advantages, from now on, the card is becoming wide-spread in various fields, for example, in identification of fees in a speedway.

The IC card, which is expected to become further popular, is often thrown away after use, so that it is necessary to mass-produce the card in low cost. However, in the production method as shown in FIGS. 14(a) and 14(b), there are problems in the mass production, cost and performance.

That is, in the conventional production method as shown in FIGS. 14(a) and 14(b), there are problems that it is difficult to position the cover body 203d with respect to the case or the spacer so that the productivity is inferior, and that the card is comparatively easily remodeled by removing the cover body 203d. Further, there are problems that the card is apt to break down since when a user puts the card in a pocket of his trousers, the electric part or connecting portion in the card is damaged by bending of the cover body or the like due to the stress applied to the card 210, or the wiring is broken due to the movement of the antenna coil 202 by vibration.

FIGS. 15 to 18 show another example of a conventional non-contact type IC card. FIG. 15 is a plan view showing a conventional non-contact type IC card, and FIG. 16 is a perspective view of the conventional IC card. FIG. 17 is a front view showing the state in which a cover body is putting on a card body in a conventional non-contact type IC card.

In the drawings, reference numeral 121 denotes the non-contact type IC card. In this non-contact type IC card 121, an IC chip 123 including a circuit necessary for achieving various objects, for example, a microprocessor or memory, is bonded to an upper surface of a module substrate 122, and the module substrate 122 is connected to an antenna coil 125 by a lead 124. Then, the module substrate 122 is mounted on an upper surface of a card substrate 121a. The loop-like antenna coil 125 for communicating data to and from the outside by an electric wave is printed substantially along an outer circumference of the upper surface of the card substrate 121a. The module substrate 122 is positioned inside the loop of the antenna coil 125 of the card substrate 121a, for example, at about a center of the card substrate 121a. After the module substrate 122 is connected to the antenna coil 125 by the lead 124, as shown in FIG. 17, a cover substrate 121b having a recess previously formed at a portion corresponding to the IC chip 123 and the module substrate 122 are stuck on the card substrate 121a so that the non-contact type IC card 121 is constructed.

However, when the non-contact type IC card 121 is carried (with a person) while for example, it is contained in a pocket of trousers of the person, only if the person wearing the trousers changes his posture, a bending stress is applied to the non-contact type IC card 121. FIG. 18 is a view explaining the state in which the conventional non-contact type IC card is bent. Since the non-contact type IC card 121 is very thin, and the card substrate 121a and the cover substrate 121b constituting the IC card 121 are often made of a soft material such as plastics, when some degree of bending stress is applied, the card may be bent as shown in FIG. 18. Particularly, since the center portion of the IC card is subjected to a concentrated bending stress and the IC module is positioned at the center portion of the IC card, the IC module is apt to be damaged.

Then, for example, as shown in FIGS. 19(a) and 19(b) or described in Japanese Patent Unexamined Publication Nos. Hei. 2-2096 or Hei. 3-158296, it was proposed that after a highly rigid reinforcing plate 126 is provided on a lower surface of the module substrate 122 of the IC module (see FIG. 19(a)) or on a surface facing the IC chip 123 (see FIG. 19(b)), the cover substrate 121b is stuck on the card substrate 121a, so that it is prevented for the plane shape of the card near the IC module from being deformed by the concentrated bending stress applied to the card substrate 121a or to the cover substrate 121b around the IC module.

However, according to this method of relaxing the bending stress by the reinforcing plate 126, there is disadvantage that since the thickness of the reinforcing plate 126 is added to the thickness of the IC module, the total thickness of the IC card becomes large and the card becomes unsuitable as the non-contact type IC card.

That is, for the former problem, countermeasures of increasing the thickness of the module substrate 122, merely adding the reinforcing plate 126 or the like inevitably increases the thickness of the IC module or the like, which is against the trend of thinning the IC card and is not preferable.

Then, in order not to increase the total thickness of the IC module even if a reinforcing plate is added, there is developed a mounting method of IC chip by tape carrier package (hereinafter referred to as TCP) using a thin film instead of the module substrate 122.

According to this TCP, at present, although the lead width of a lead connecting an IC chip in an IC module to an external electrode is about 50 μm and the pitch thereof is about 100 μm, recently, demand for making the IC card smaller and thinner is high and higher density mounting is strongly desired. Thus, in order to make lead pattern finer and make more pins, the lead width and lead pitch must be small.

As a result, as the lead width becomes small, the lead strength is lowered, so that when a bending stress is applied to the IC module, the connection portion between the lead and the IC chip becomes unstable, which may damage the entire of the IC card.

Accordingly, to cope with the problem of the prior art, the present invention is intended to provide an IC card applying an IC module which is able to prevent damage of an IC chip or lead without increasing the thickness of the IC card, and particularly in a non-contact type IC card required to make thin, an object of the present invention is to provide a structure by which even if a bending stress is applied, the IC module is hardly damaged.

A further object of the present invention is to provide the structure of an IC card by which a reliable IC card can be mass-produced in low cost, and to provide the method of producing the same.

DISCLOSURE OF THE INVENTION

According to a first aspect of the present invention, in a non-contact type IC card in which a loop antenna coil is mounted substantially along the outer circumference of a flat rectangular card body when the card body is viewed in a plane, and further an electric part is mounted on the card body, the electric part is disposed outside the antenna coil when the card body is viewed in a plane.

In this manner, when the module substrate is disposed outside the loop of the antenna coil when viewed in a plane, even if a bending stress is applied to the non-contact type IC card and the card body constituting the non-contact type IC card is bent, since the module substrate and the integrated circuit chip are positioned at a portion except the center portion of the card body which is apt to be subjected to the effect of the bending stress, the bending stress is hardly applied to the module substrate and the integrated circuit chip, and there is little fear that the module substrate and the integrated circuit chip are broken.

According to a second aspect of the present invention, in an IC card in which an IC module comprising a film substrate and an IC chip fixed to the film substrate are embedded, a reinforcing plate is provided on the film substrate at the side of attachment of the IC chip and along an outer circumference edge of the IC chip, and a loop-like antenna coil is formed substantially along an outer circumference of the IC module.

According to the second aspect of the present invention, since the reinforcing plate is provided on the film substrate at the side of attachment of the IC chip and along the outer circumference edge of the IC chip, the reinforcing plate does not overlap with the IC chip in the thickness direction of the film substrate so that the increase of the thickness of the IC module due to the provision of the reinforcing plate can be diminished or vanished.

Further, since the reinforcing plate reinforces the film substrate around the IC chip, even if a mechanical stress, especially a bending stress being apt to be concentrated to the center portion of the IC card is applied from the outside, breakage or damage of the IC chip due to bending or warp of the film substrate in the IC module can be diminished. Further, since the connection portion between the lead and the IC chip formed on the film substrate becomes stable, the reliability is improved.

According to a third aspect of the present invention, a non-contact type IC card is characterized in that in the structure of the non-contact type IC card containing a built-in electric part and antenna coil, at least a part of the electric part and the antenna coil is embedded in an insulating fixing resin, the fixing resin is cured while a resin film is press-contacted with at least one surface of the fixing resin, and a part of the fixing resin and the film are drilled at the same time to form the IC card.

According to a fourth aspect of the present invention, a method of producing a non-contact type IC card is characterized in that in the method of producing the non-contact type IC card having a built-in electric part and antenna coil in the card, after a semisolid fixing resin is filled into a resin hole formed of a resin film and a spacer having a hole wider than the outer area of the card and thicker than the height of the electric part, the electric part and the antenna coil are embedded into the fixing resin and temporarily fixed, the fixing resin is cured in the state in which a film is press-contacted with at least one surface of the fixing resin, and a part of the fixing resin and the film are concurrently drilled to form the IC card.

According to the structure of the third aspect of the invention, the substrate and the antenna coil can be easily and certainly fixed to a predetermined position. Further, according to the production method of the fourth aspect of the invention, positioning of the card body and the film is easily conducted and the IC card is continuously produced.

BEST MODE EMBODYING THE INVENTION

Preferred embodiments of the invention will be described below based on the accompanying drawings.

Figure 1:
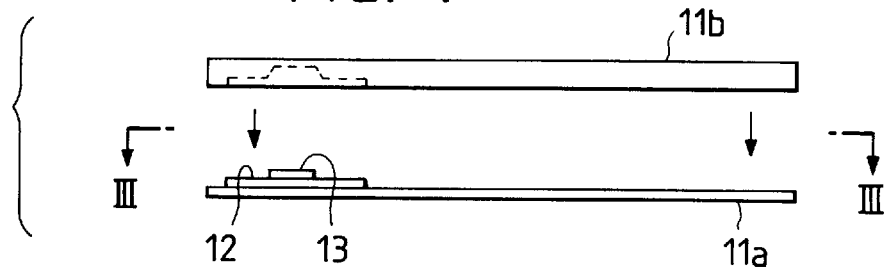
FIG. 1 is a front view showing a state in which a card body and a cover body are about to be stuck on each other in a first embodiment.
Figure 2:
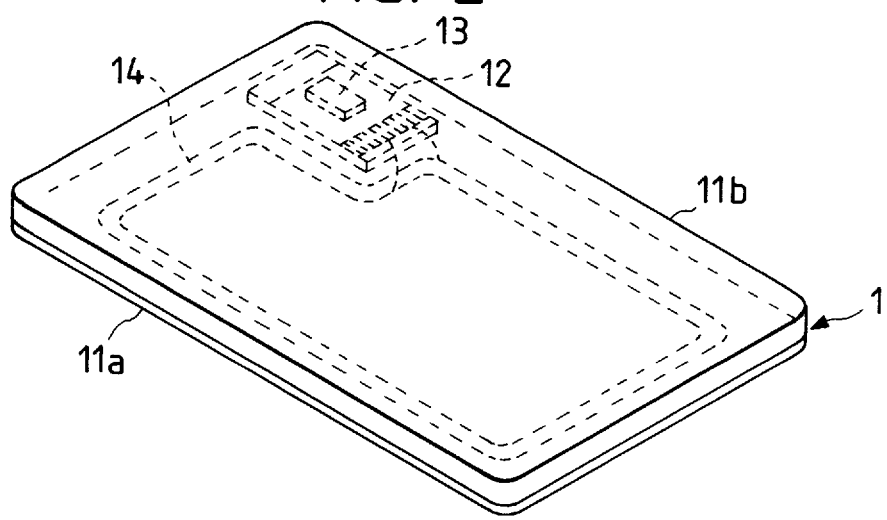
FIG. 2 is a perspective view showing the first embodiment.
Figure 3:
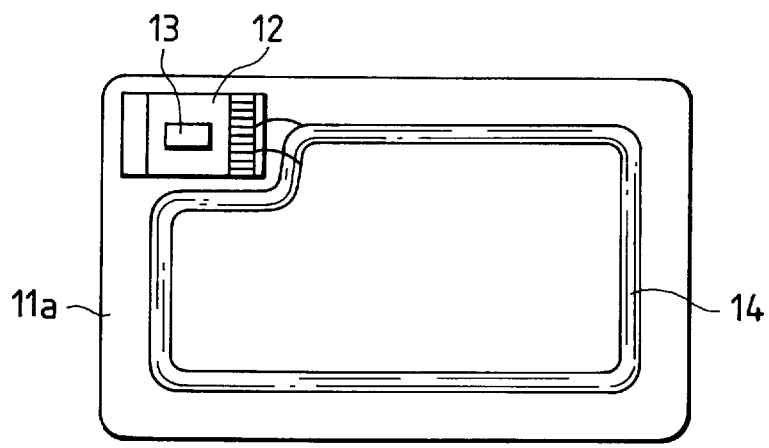
FIG. 3 is a view taken along III—III of FIG. 1.

FIGS. 1 to 3 show a first embodiment. In the drawings, reference numeral 1 denotes a non-contact type IC card. In the non-contact type IC card 1, an electric part such as an integrated circuit chip 13 including a built-in circuit necessary for attaining various purposes such as a microprocessor or a memory, is first mounted on an upper surface of a module substrate 12. The electric part in the present invention includes, other than the integrated circuit chip or the like, a mechanical part such as the module substrate as a supporting body for the integrated circuit chip. Next, the module substrate 12 is mounted on an upper surface of a flat rectangular card body 11a made of plastics or the like, and further a loop antenna coil 14 used for exchanging data to the outside through an electric wave is printed substantially along the outer circumference of the upper surface of the card body 11a when viewed in a plane. The module substrate 12 is disposed outside the loop of the antenna coil 14 of the card body 11a when viewed in a plane and at an end near a short side of a rectangle of the card body 11a. After the module substrate 12 and the antenna coil 14 are connected to each other, as shown in FIG. 1, a flat rectangular cover body 11b having a molded recess at a portion corresponding to a position of the integrated circuit chip 13 and the module substrate 12 in advance, is stuck on the card body 11a.

Figure 18:
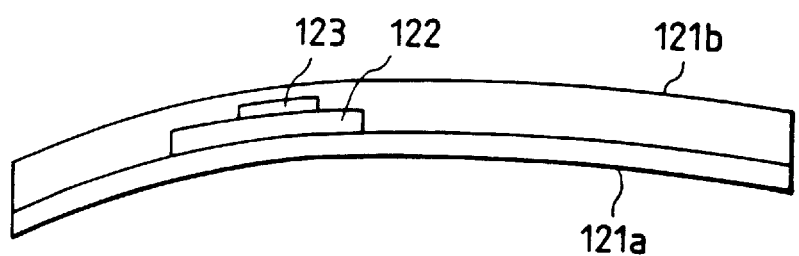
FIG. 18 is a view explaining the state in which the conventional non-contact type IC card is bent.
Figure 19A:
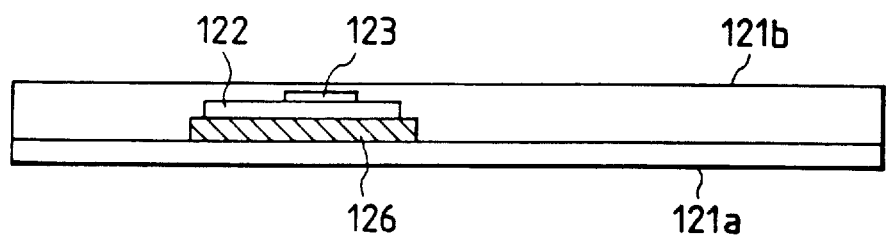
FIGS. 19(a) and 19(b) are front views showing a conventional IC module and IC card provided with a reinforcing plate, respectively.
Figure 19B:
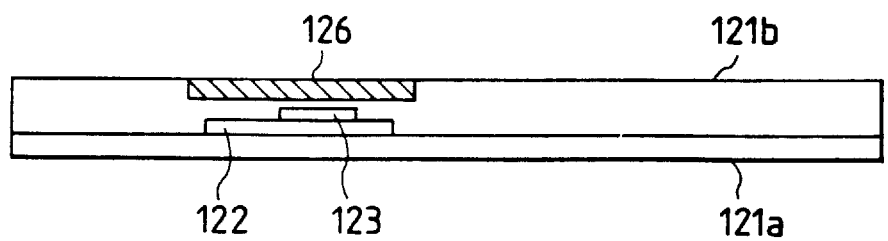

In this manner, when the module substrate 12 is disposed outside the loop of the antenna coil 14 when viewed in a plane, even if a bending stress is applied to the non-contact type IC card and the card body 11a constituting the non-contact type IC card 1 is bent as shown in FIG. 18, since the module substrate 12 and the. integrated circuit chip 13 are positioned at a portion remote from the center portion of the card body 11a which is apt to be subjected to the effect of the bending stress, the bending stress is hardly applied to the module substrate 12 and the integrated circuit chip 13, and there is little fear that the module substrate 12 and the integrated circuit chip 13 are damaged.

Also when the integrated circuit chip is directly mounted on the card body without the intervening module substrate, when the integrated circuit chip is disposed outside the loop of the antenna coil of the card body when viewed in a plane and at an end portion near the short side of the card body, similar effects to the first embodiment can be obtained.

Figure 4:
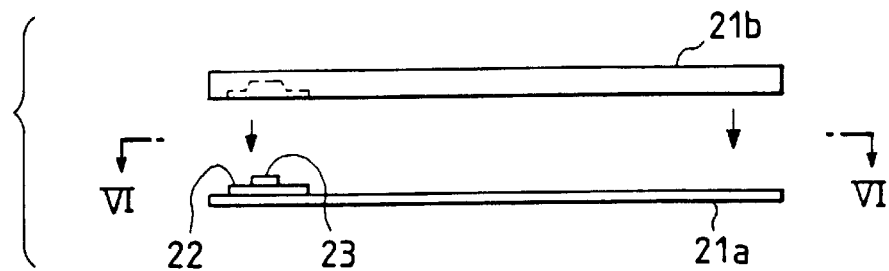
FIG. 4 is a front view showing a state in which a card body and a cover body are about to be stuck on each other in a second embodiment.
Figure 5:
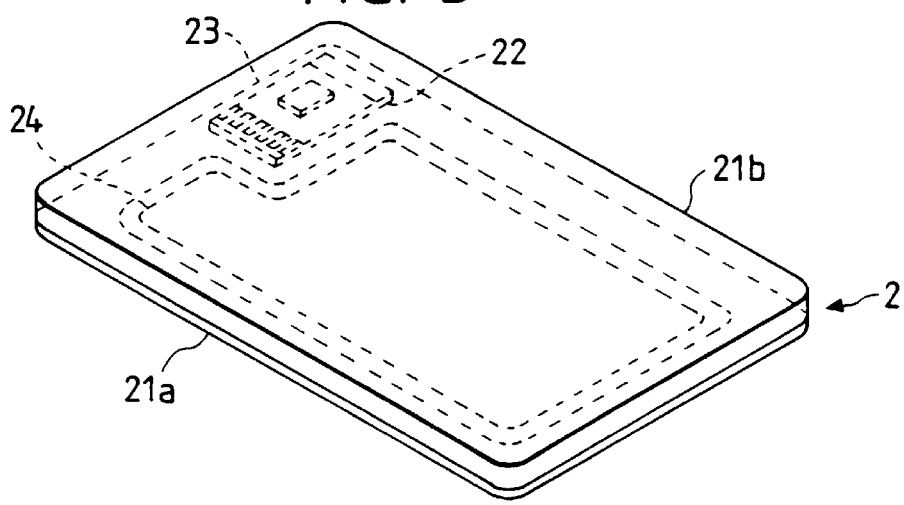
FIG. 5 is a perspective view showing the second embodiment.
Figure 6:
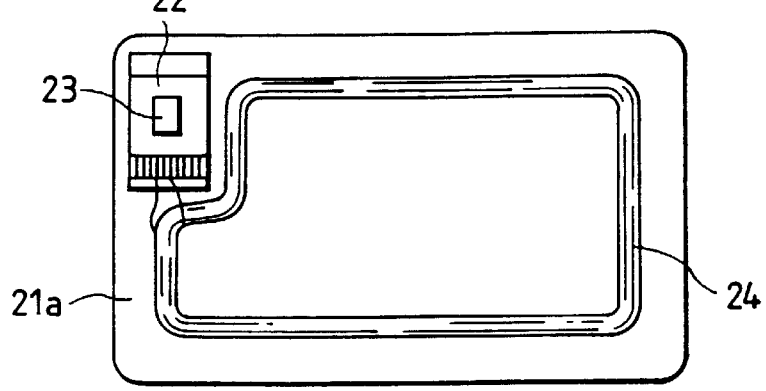
FIG. 6 is a view taken along VI—VI of FIG. 4.

Further, as in a second embodiment as shown in FIGS. 4 to 6, when a long side of a rectangle of the module substrate 22 is made parallel with a short side of a rectangle of the card body 21a constituting the non-contact type IC card 2, the long side of the rectangle of the module substrate 22 is not parallel with the long side of the rectangle of the card body 21a, in other words, there is no fear that the easily bent sides are parallel to each other. Thus, the card body 21a and the module substrate 22 becomes hard to be bent. Accordingly, in addition to the effects of the first embodiment, there is less fear that the module substrate 22 and the integrated circuit chip 23 mounted thereon are damaged.

Further, when the integrated circuit chip is directly mounted on the card body without the intervening module substrate, or when the module substrate is made of a film like soft material (that is, when both a long side and a short side of a rectangle are much easily bent as compared with the module substrate made of a hard material), if a long side of the rectangle of the integrated circuit chip is made parallel with a short side of the rectangle of the card body, it is needless to say that similar effects to the second embodiment can be obtained.

In the above embodiments, the non-contact type IC card composed of the cover body stuck on the card body mounting the integrated circuit chip or the like thereon has been described. However, also in other non-contact type IC card, for example, in a non-contact type IC card formed by placing a card body mounted with an integrated circuit chip thereon into a predetermined mold and integrally molding through injection of a resin, it goes without saying that similar effects to the above embodiments can be obtained.

Figure 7:
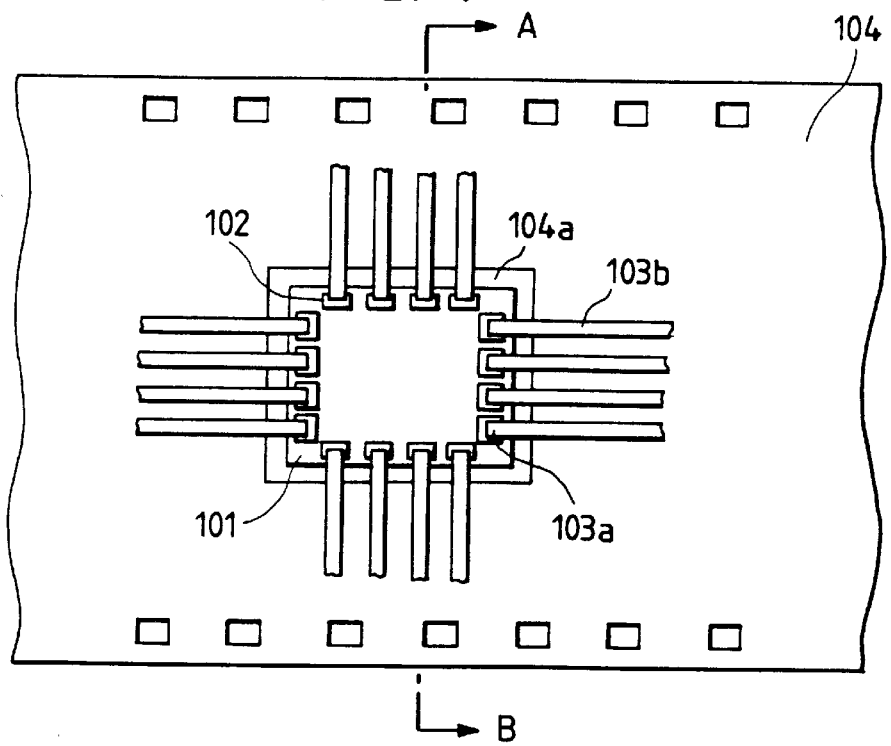
FIG. 7 is a partial plan view showing portions around an opening of a tape carrier on which an IC chip of an IC module of a third embodiment of the present invention is mounted.

FIGS. 7 to 12 are views explaining an IC module of a third embodiment of the present invention and a method of producing an IC card by applying the IC module. FIG. 7 is a partial plan view showing a portion around an opening of a tape carrier on which one IC chip is mounted in the case of producing the IC module by an assembling method of the TCP.

First, there is formed the IC module in which an electric part such as an IC chip 101 having a built-in circuit necessary to achieve various purposes, for example, a microprocessor or a memory, is provided on a lower surface side of a film substrate 104. In the present invention, the concept of the IC module comprises a mechanical part such as the film substrate as a support of the IC chip 101 in addition to the IC chip 101.

Figure 8A:
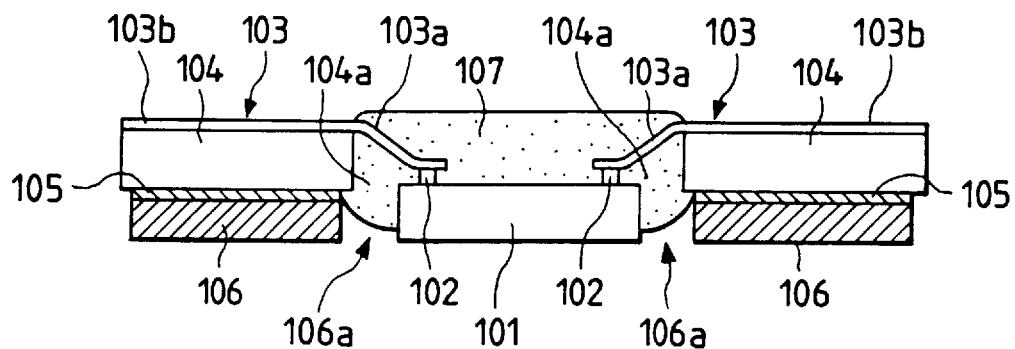
FIGS. 8(*a*) and 8(*b*) are a sectional explanatory view and a schematic perspective view of the IC module of the third embodiment of the present invention, respectively.
Figure 8B:
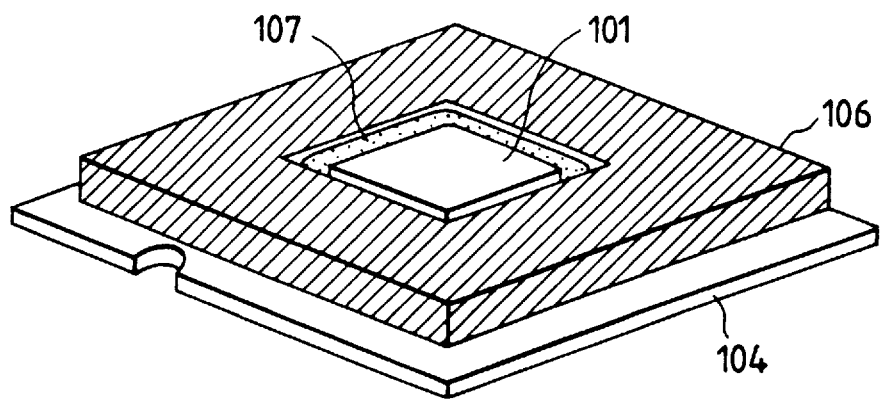

FIG. 8(a) is a view explaining the IC module corresponding to a cross section taken along line A-B in FIG. 7, and FIG. 8(b) is a schematic perspective view showing the IC module reversing that shown in FIG. 8(a).

The film substrate 104 is provided with an opening 104a on which the IC chip 101 is mounted. A tip inner lead 103a of a lead 103 provided on the film substrate 104 protrudes to the opening 104a, and the tip thereof is connected to a bonding bump electrode 102 of the IC chip 101 by heat press-contact. A reinforcing plate 106 having an opening 106a larger than the opening 104a is stuck on a surface of the film substrate 104 at the side of attachment of the IC chip 101 by an adhesive 105 along an outer circumference edge of the IC chip 1.

The thickness of the reinforcing plate 106 may arbitrarily determined as long as the thickness of the IC module is not extremely increased by the thickness of the reinforcing plate much larger than that of the IC chip protruding the surface of the film substrate 104. However, it is preferable that the thickness of the reinforcing plate is comparable with the IC chip protruding the surface of the film substrate 104 in view of the strength and making thin.

It is not necessary to stick the reinforcing plate 106 continuously along the entire outer circumference edge of the opening 104a but the reinforcing plate may continue intermittently at parts of the outer circumference edge.

As shown in FIG. 8(a), a forming treatment is carried out so that the tip of the inner lead 103a is pressed down toward the depth direction of the film substrate 104 of the opening 104a, which prevents the short circuit between the inner lead 103a and the end of the IC chip 101 from occurring so as to improve the reliability. In this embodiment, although the tip of the inner lead 103a is bent downward, the present invention is not limited to this.

The IC module by such an assembling method of the TCP and the IC card are produced as follows.

As shown in FIG. 7, the opening 104a is provided in the film substrate 104 for the TCP, and a lead pattern as a wiring pattern is formed on the film substrate 104 by copper foils. The film substrate 104 is a flexible film made of polyimide, glass epoxy, polyester or the like. A portion of the lead pattern protruding the opening 104a is the inner lead 103a and a portion thereof on the film substrate 104 is an outer lead 103b. Next, the bump electrode 102 for connection with the inner lead 103a is formed on an electrode terminal pad of the IC chip 101.

The IC chip 101 is positioned at the center of the opening 104a of the film substrate 104 having the above described structure from the front side of the lead pattern formation surface or the reverse side of the lead pattern formation surface. Then, the tip of the inner lead 103a is thermally press-contacted with the bump electrode 102 by a bonding tool not shown so that the IC chip 101 is mounted on the film substrate 104.

Figure 9:
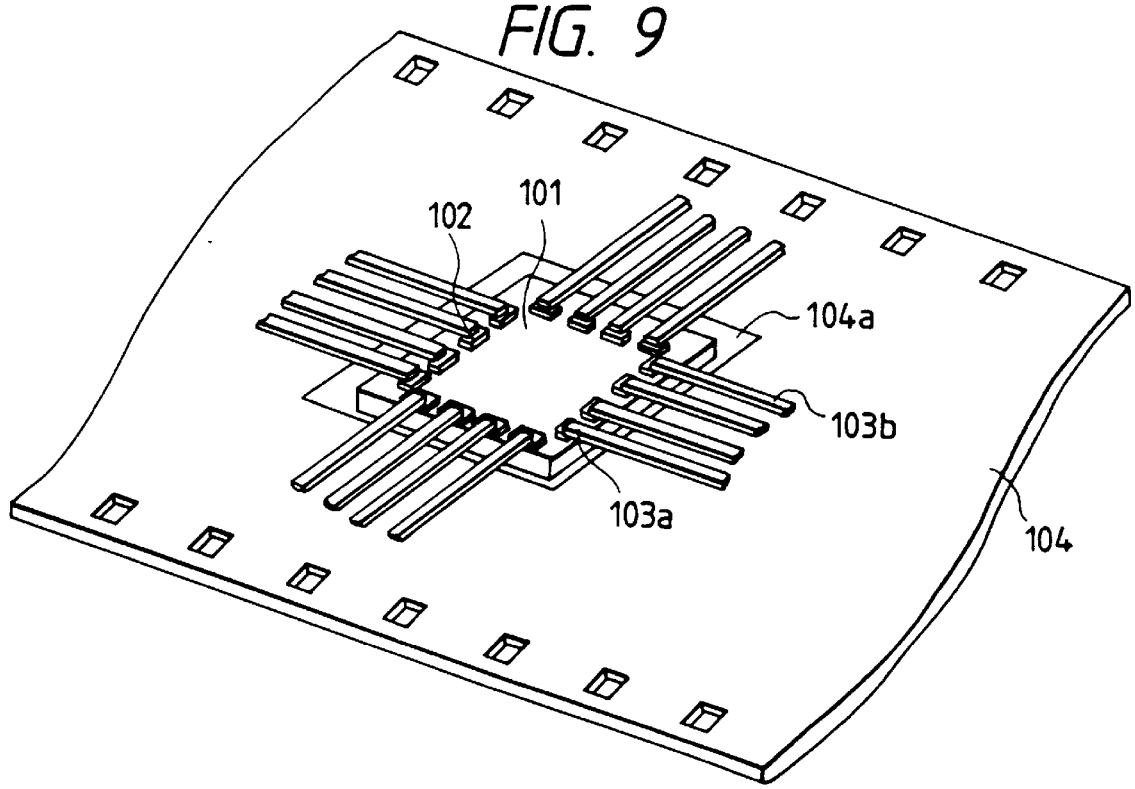
FIG. 9 is a view explaining the mounting of the IC chip of the third embodiment of the present invention.

FIG. 9 is a view explaining the state in which the IC chip 103 is connected to the inside of the opening 104a from the reverse side of the lead pattern formation surface. The opening 104a is made slightly larger than the IC chip 101, and at the side of the attachment surface of the IC chip 101 of the IC module, the reinforcing plate having the opening 106a larger than the opening 104a is stuck on the reverse surface of the film substrate 104 by the adhesive 105 so as to surround the opening 104a.

The reinforcing plate 106 is made of a metal such as aluminum, a conductive material such as a high rigidity metal or alloy, a resin such as polyimide or polyester epoxy, a plate material of a bake plate, glass epoxy, glass or the like, or other insulating materials. Among those, the conductive material is preferable since it also serves as a shield against magnetic noise and electromagnetic wave noise to the circuit of the IC chip. A light material such as aluminum or a metal material including aluminum is more preferable.

As shown in FIG. 8(a), after the IC chip 101 and the reinforcing plate 106 are attached, a liquid or past-like resin is filled into the openings 104a and 106a by potting and is cured to seal the connecting portion between the IC chip 101 and the inner lead 103a by the resin 107, so that the IC module using the TCP is completed.

In order to quickly protect the connecting portion between the IC chip and the lead with the resin, the IC chip 101 may be sealed with the resin 107 before the reinforcing plate 106 is attached to the film substrate 104. The resin 107 is made of, for example, a high quality epoxy resin which is a resin generally used for sealing.

Figure 10:
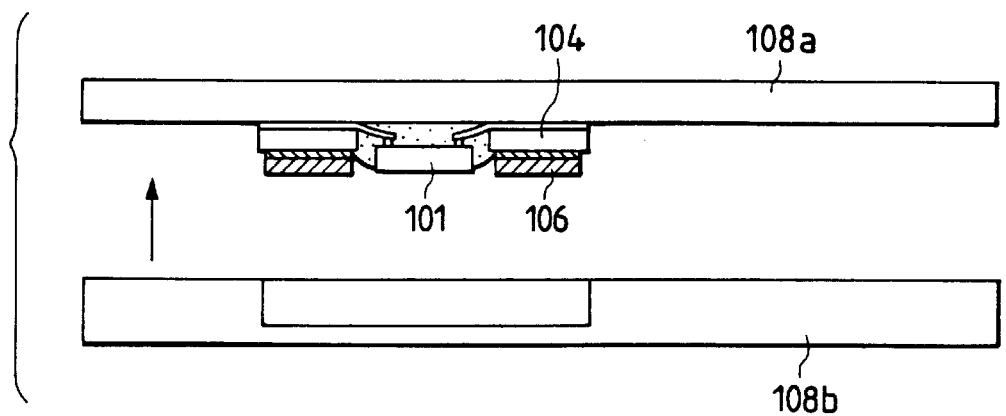
FIG. 10 is a front view explaining the state in which a cover substrate is about to be stuck on a card substrate of the IC card of the third embodiment of the present invention.

Next, as shown in FIG. 10, the IC module formed by the assembling method of the TCP is mounted on a lower surface of a card substrate 108a made of plastics or the like. A loop-like antenna coil, not shown, for communicating data to and from the outside by an electromagnetic wave is printed on the card substrate 108a along substantially an outer circumference of the lower surface of the card substrate 108a when viewed in a plane. After the lead pattern of the IC module is connected to the antenna coil, a cover substrate 108b having a recess previously formed at a portion corresponding to the position of the IC module such as the film substrate 104, the IC chip 101 and the reinforcing plate 106, is stuck on the card substrate 108a so that the IC card is formed.

The reinforcing plate stuck on the film substrate of the IC module embedded in the IC card is not required to be one plate as long as it is flat. It is apparent that the similar effect can be expected even if the reinforcing plate is composed of a plurality of divided pieces.

However, when the reinforcing plate formed along the outer circumference edge of the IC chip and stuck on the film substrate is made of one flat plate, unevenness is not formed around the circumference of the IC chip when the IC module is stuck on the IC card substrate and the cover substrate, and also the strength of the card can be increased. That is, there is an advantage that the damage of the IC chip due to the bending stress applied to the IC card is more effectively prevented.

In the above embodiment, the IC card including the card substrate, the cover substrate stuck thereon, and the IC module contained in the card susbtrate and the cover substrate has been described. However, it is needless to say that the similar effects can be obtained for other IC card in which for example, an IC module mounted with an IC chip and the like or a card substrate mounted with an IC module is put in a predetermined mold and a resin is injected therein to integrally form the IC card.

Figure 11:
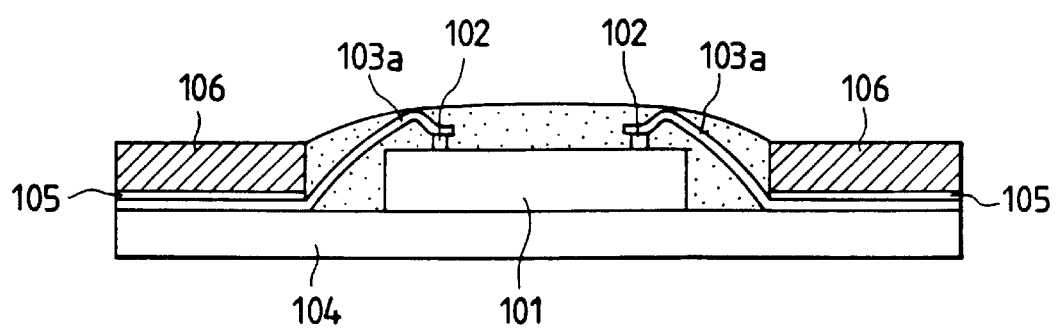
FIG. 11 is a sectional explanatory view showing an IC module of a fourth embodiment of the present invention.

FIG. 11 is a sectional view showing an IC module of a fourth embodiment of the present invention.

An IC chip 101 is mounted on a film substrate 104 without an opening, and a bonding bump electrode 102 of the IC chip 101 is thermally press-contacted with a lead terminal of wiring pattern formed on the film substrate 104.

At the side of the same surface of the film substrate 104 as the attachment surface of the IC chip 101, a reinforcing plate 106 having an opening 106a so as to surround the outer circumference of the IC chip 101 is stuck on the surface of the film substrate 104 by an adhesive 105. Thus, like the first embodiment, the increase of the thickness of the entire IC module can be diminished or vanished.

Similarly to the third embodiment, after the IC chip and the reinforcing plate are attached, the potting resin 107 is filled into the opening 106a to make seal.

Further, although the fourth embodiment adopts the mounting method of the IC chip by the TCP, mounting methods are not limited to this. For example, the IC chip may be mounted such that after the IC chip is put on the module substrate of the IC card, the IC chip is connected to the lead terminal provided on the module substrate by wire bonding.

The third and fourth embodiment of the present invention can provide a thin and reliable IC card in which the increase of the thickness of the IC card can be diminished or vanished, and even when the IC card is bent or warped by a bending stress from the outside, the bending stress is hardly applied to the IC module or IC chip so that it is effectively protected.

Particularly, in the non-contact type IC card required for making thin, there is obtained remarkable effects to prevent the IC module or the IC chip from being damaged.

Figure 12A:
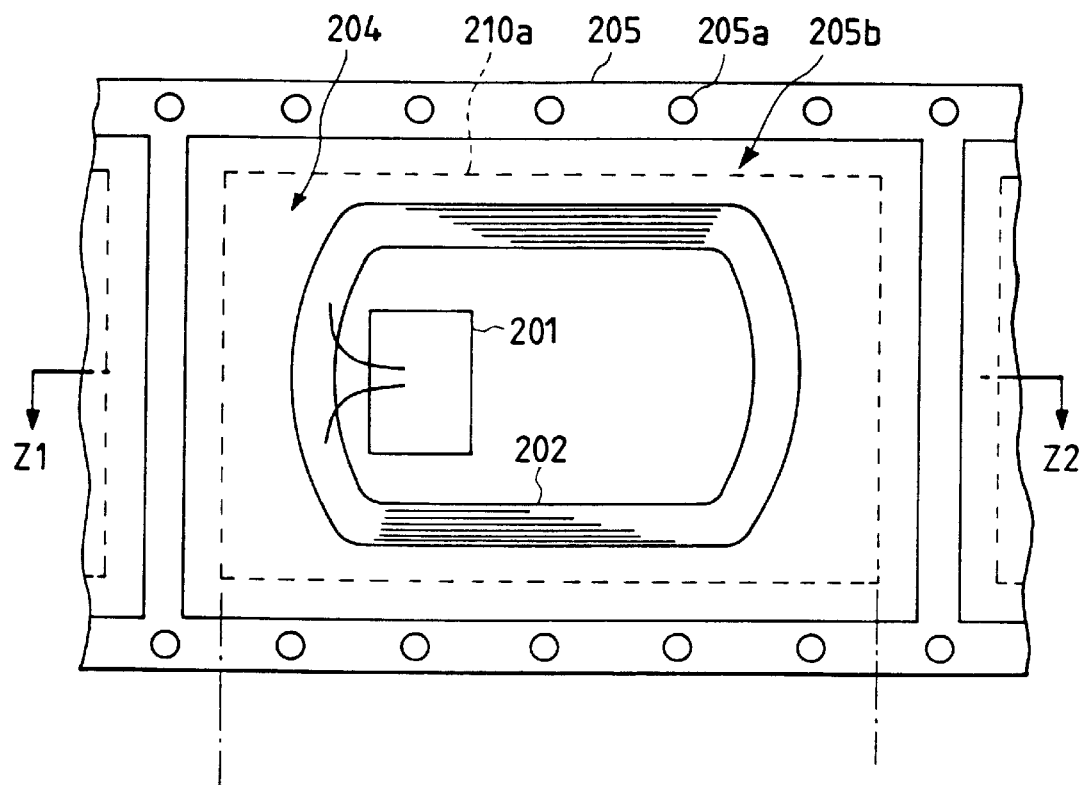
FIG. 12(a) is a top view showing the structure of a non-contact type IC card of the fifth embodiment of the present invention.
Figure 12B:
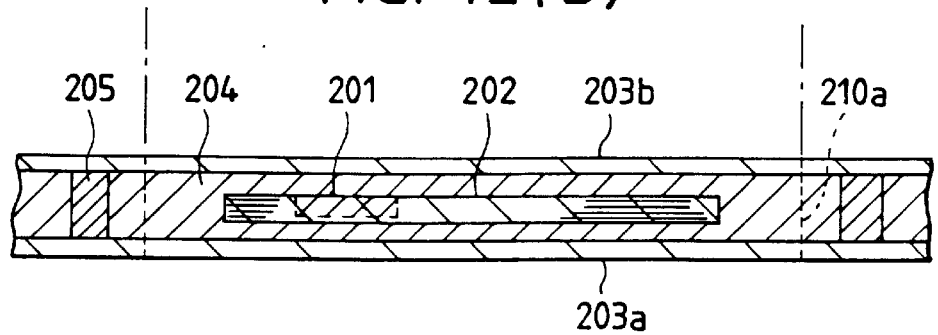
FIG. 12(b) is a side sectional view showing the structure of the non-contact type IC card of fifth embodiment.

In the following, the structure of a non-contact type IC card (hereinafter referred to as IC card) according to a fifth embodiment of the present invention and a production method will be described in detail with reference to FIGS. 12(a), 12(b) and 13. FIGS. 12(a) and 12(b) are explanatory views showing the structure of the IC card of the invention, in which FIG. 12(a) is a top view, and FIG. 12(b) is a sectional view showing the cross section taken along line Z1-Z2 of FIG. 12(a).

In the top view of FIG. 12(a) and the side sectional view of FIG. 12(b), a spacer 205 is made of a metal such as iron or copper having the thickness of 0.5 mm to 2.0 mm. The spacer includes a resin hole 205b wider than the outer area of the IC card and thicker than the height of the electric part, and band surfaces at both sides of the spacer include feeding holes 205a for positioning and feeding the spacer 205 to the subsequent step. Films 203a and 203b at upper and lower sides are formed of polyethylene terephthalate (PET) or the like having the thickness of about 0.1 mm, and feeding holes corresponding to the feeding holes 205a of the spacer 205 are provided. An electric part such as a microcomputer or a capacitor for detecting the received electric wave to obtain electric power and data and for transmitting data, is mounted on a substrate 201, and an antenna coil 202 of copper wires wound in the coil shape for receiving and transmitting the electric wave is connected.

A semisolid fixing resin 204 such as plastic resin is filled into a recess portion formed of the film 203a provided with a predetermined indication and the resin hole 205b, and the substrate 201 and the antenna coil 202 are embedded therein. The upper portion of the spacer 205 in this state is covered with the film 203b and is heated to cure the resin 204. Then, a cutting portion 210a indicated by a dotted line is drilled by a drilling device mentioned after to form the IC card.

In FIGS. 12(a) and 12(b), although the substrate 201 positions inside the antenna coil 202, it may be positioned outside the antenna coil 202, and the position and size of the substrate is not restricted.

The spacer 205 may be made of an alloy such as stainless steel other than a metal such as iron or copper, and may be a resin if reuse described later is not considered. The fixing resin 204 may be made of, other than the plastic resin, a thermoplastic polyester resin such as polybutylene terephthalate (PBT) or a thermosetting resin such as epoxy resin or phenol resin as long as the resin is insulating one. The film may be any resin other than the above-mentioned PET as long as it resists the temperature of about 150° C. and can be provided with an indication on the surface. A predetermined indication is provided on at least one of the upper and lower films.

Figure 13:
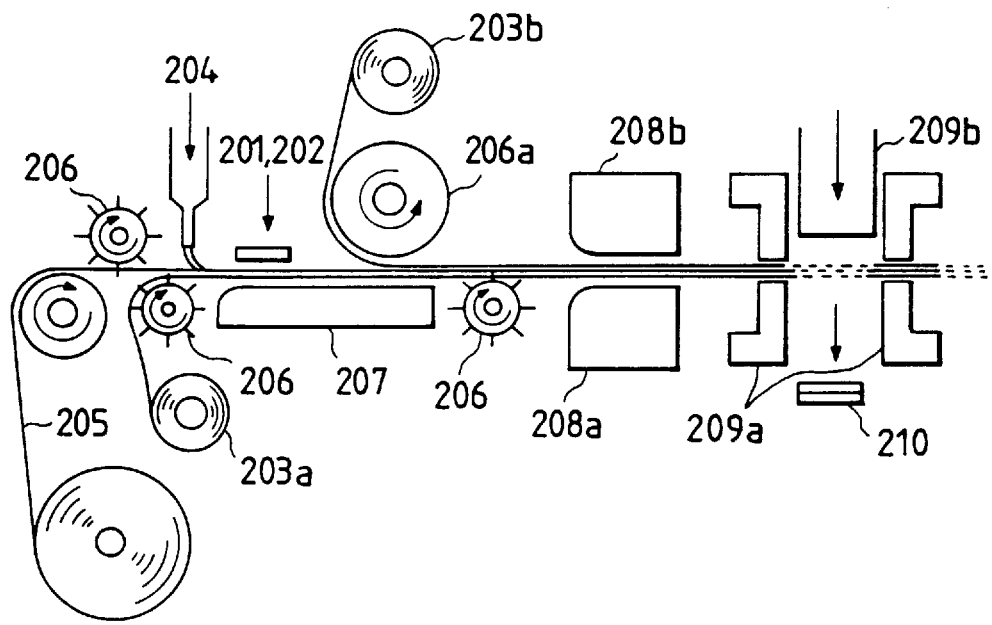
FIG. 13 is an explanatory view showing a production method of the non-contact type IC card of the present invention.
Figure 14A:
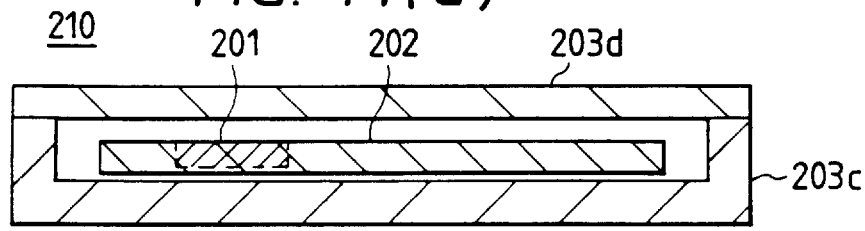
FIGS. 14(a) and 14(b) are explanatory views showing the structure of a conventional non-contact type IC card, respectively.
Figure 14B:
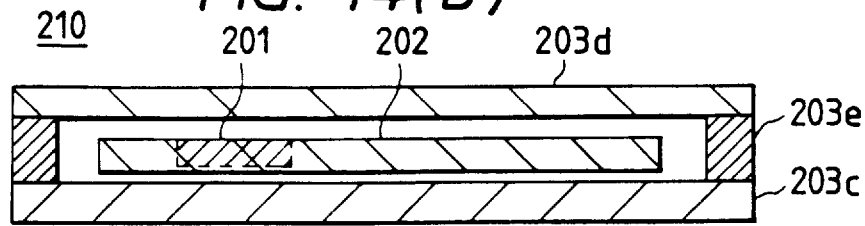
Figure 15:
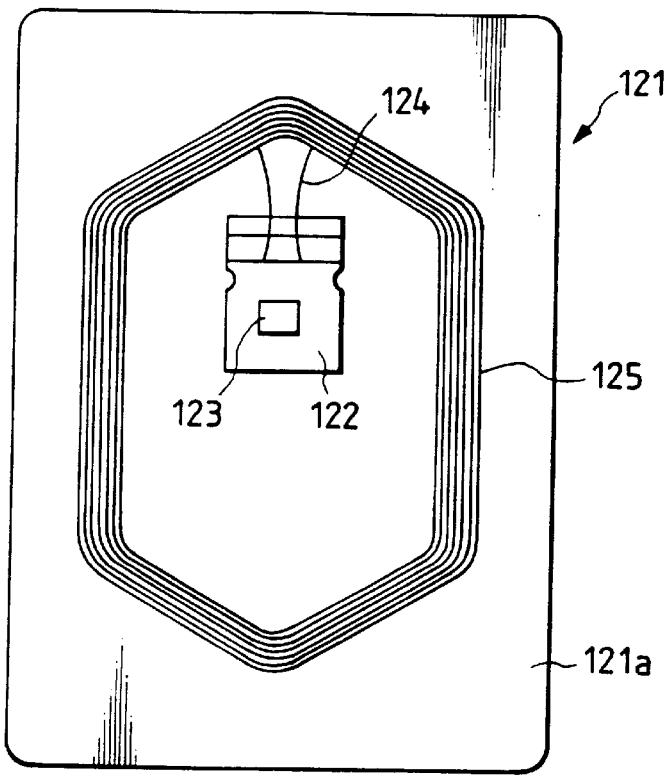
FIG. 15 is a plan view showing another conventional non-contact type IC card.
Figure 16:
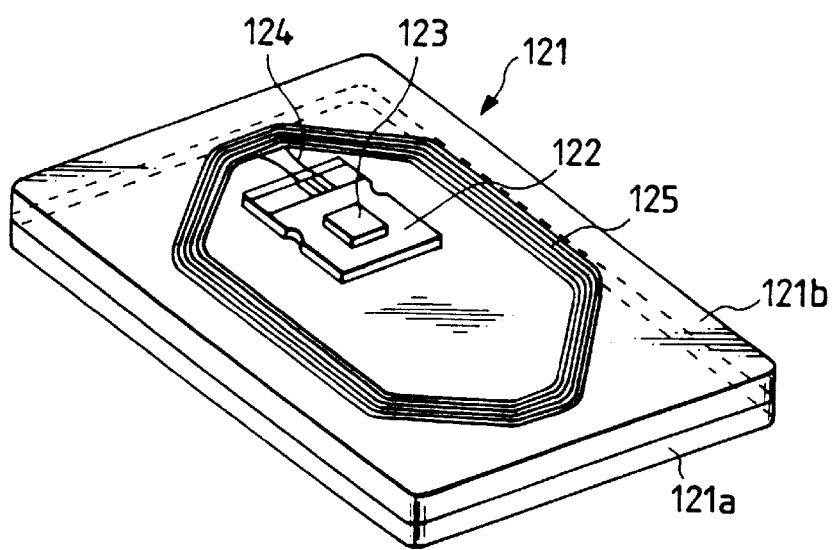
FIG. 16 is a perspective view showing the conventional non-contact type IC card.
Figure 17:
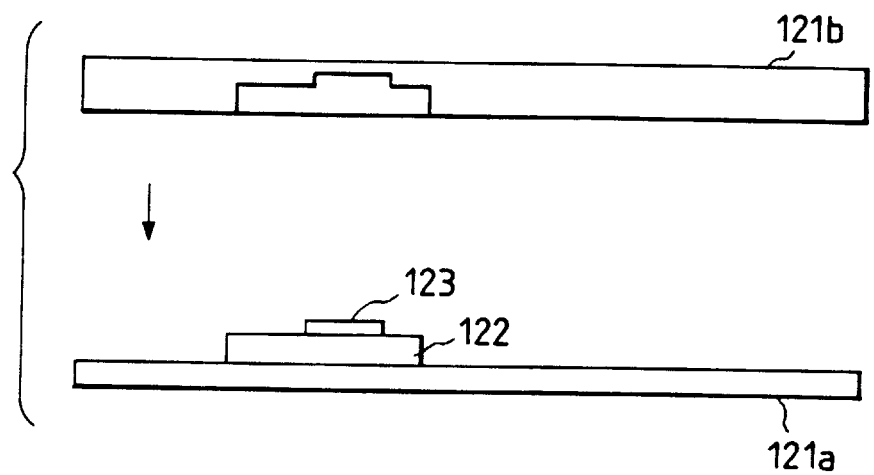
FIG. 17 is a front view showing the state in which a cover substrate is about to be stuck on a card substrate in the conventional non-contact type IC card.

FIG. 13 is an explanatory view showing an example of a production method of the IC cards of the present invention. The production method will be described based on FIG. 13. The spacer 205 wound in a roll and the lower film 203a are extracted by a feeding roller 206 having protrusions fitted into the feeding holes 205a, and are press-contacted to each other to form the recess portion for storing the fixing resin 204. The semisolid fixing resin 204 is filled into the thus formed recess portion, the substrate 201 and the antenna coil 202 are disposed at a predetermined position on a support 207, and then while being covered with the upper film 203b wound in a roll, press-contact is conducted by a press-contact roller 206a so that the substrate 201 and the antenna coil 202 are embedded in the fixing resin 204. The thus continuously formed IC cards are heated by heaters 208a and 208b up to the temperature of 100°–150° C. to cure the fixing resin 204, and are stuck integrally on the films 203a and 203b. Finally, the upper and lower portions of the continuously formed IC cards are pinched by a pinching device 209a and are drilled by the drilling device 209b to form the respective IC cards 210.

In this embodiment, the lower and upper films 203a and 203b are used. However, by certainly pushing the substrate 201 and the antenna coil 202 by a thin bar or the like, the fixing resin 204 may be cured without using the upper film 203b. At this time, a photosetting resin such as urethan acrylate as the fixing resin 204 may be used, which is cured by an ultraviolet ray lamp or the like instead of the heaters 208a and 208b. In this case, the film is made of a resin resistant to ultraviolet rays than heat, and after the fixing resin 204 is cured, the upper film 203b is stuck and integral drilling is conducted.

When this production method is used, the electric part 201 and the antenna coil 202 are certainly fixed to the fixing resin 204, so that the card is strong against the stress and the wire is not broken by vibration or the like. Thus, the reliability is improved. Further, positioning of the IC card and the film is easily and certainly conducted. Further, since the IC card and the film are integrally cut at the cutting portion 210a, it is not necessary to mind that the fixing resin or adhesive between the IC card and the film leaks out at the end of the IC card. The spacer 205 after the IC card is drilled, can be reused if it is wound while the resin 204 is removed, so that the effect of further reducing the cost can be expected.

As described above, according to the structure of the fifth embodiment, the substrate and the antenna coil can be easily and certainly fixed to a predetermined position, so that the reliability of the IC card can be increased, and the production steps of the IC card can be simplified to provide the IC card in lower cost.

Further, according to the production method of the invention, positioning of the card body and the film is easily conducted, and the IC card can be continuously produced, so that the IC cards can be mass-produced and the cost can be reduced.

What is claimed is:

1. A non-contact type IC card comprising:
   a flat rectangle card body;
   a loop antenna coil mounted on said flat rectangle card body substantially along an outer circumference of said card body; and
   an electric part mounted on said card body;
   wherein said electric part is disposed outside the loop of said antenna coil when said card body is viewed in a plane.

2. The non-contact type IC card as claimed in claim 1, wherein a long side of a rectangle of said electric part is made parallel with a short side of a rectangle of said card body.

3. The non-contact type IC card as claimed in claim 1, wherein said electric part comprises a film substrate, an IC chip attached to said film substrate, and a reinforcing plate provided on said film substrate along an outer circumference edge of said IC chip at a side of an attachment surface to which said IC chip is attached.

4. The non-contact type IC card as claimed in claim 3, wherein said reinforcing plate is one flat plate formed along the outer circumference edge of said IC chip.

5. The non-contact type IC card as claimed in claim 3, wherein said reinforcing plate is made of a metal.

6. The non-contact type IC card as claimed in claim 1, wherein at least a part of said electric part and said antenna coil is embedded in an insulating fixing resin, and said fixing resin is cured while a resin film is press-contacted with at least one surface of said fixing resin.

7. A method of producing a non-contact type IC card having a built-in electric part and an antenna coil in said card, the method comprising the steps of:

filling a semisolid fixing resin into a resin hole formed of a resin film and a spacer having a hole wider than an outer area of said card and thicker than said electric part;

embedding said electric part and said antenna coil in said fixing resin to temporarily fixing said electric part and said antenna coil;

curing said fixing resin while a film is press-contacted with at least one surface of said fixing resin; and drilling a part of said fixing resin and said film at the same time to form said non-contact type IC card.

8. The method of producing a non-contact type IC card as claimed in claim 7, wherein said spacer at both sides of said part of said fixing resin and said film drilled at the same time includes feeding holes for positioning and feeding said spacer to a subsequent step, and protrusions of a feeding roller are fitted into said feeding holes so that automatic positioning is conducted.

* * * * *